United States Patent
Pellenc et al.

(10) Patent No.: US 11,358,297 B2
(45) Date of Patent: Jun. 14, 2022

(54) ELECTRIC CUTTING TOOL WITH AUTOMATIC EMERGENCY STOP

(71) Applicant: PELLENC, Pertuis (FR)

(72) Inventors: Roger Pellenc, Pertuis (FR); Bernard Lopez, La Tour D'Aigues (FR)

(73) Assignee: Pellenc, Pertuis (FR)

( * ) Notice: Subject to any disclaimer, the term of this patent is extended or adjusted under 35 U.S.C. 154(b) by 82 days.

(21) Appl. No.: 16/646,850

(22) PCT Filed: Nov. 20, 2018

(86) PCT No.: PCT/FR2018/052912
§ 371 (c)(1),
(2) Date: Feb. 8, 2021

(87) PCT Pub. No.: WO2019/102127
PCT Pub. Date: May 31, 2019

(65) Prior Publication Data
US 2021/0162619 A1    Jun. 3, 2021

(30) Foreign Application Priority Data
Nov. 23, 2017  (FR) ...................................... 17/71254

(51) Int. Cl.
*B26D 7/24* (2006.01)
*A01G 3/037* (2006.01)
*B26B 15/00* (2006.01)

(52) U.S. Cl.
CPC .............. *B26D 7/24* (2013.01); *A01G 3/037* (2013.01); *B26B 15/00* (2013.01)

(58) Field of Classification Search
CPC . B26D 7/24; B26D 7/22; A01G 3/037; A01G 3/085; B26B 15/00; H03K 17/9645;
(Continued)

(56) References Cited

U.S. PATENT DOCUMENTS

| 5,025,175 A | 6/1991 | Dubois, III |
| 7,365,955 B2 | 4/2008 | Mather et al. |
(Continued)

FOREIGN PATENT DOCUMENTS

| EP | 2490865 A1 | 8/2012 |
| EP | 2825811 A1 | 1/2015 |
(Continued)

OTHER PUBLICATIONS

English Translation of the International Search Report for corresponding PCT/FR2018/052912.
(Continued)

*Primary Examiner* — Jonathan G Riley
(74) *Attorney, Agent, or Firm* — Egbert, McDaniel & Swartz, PLLC

(57) ABSTRACT

A safety cutting tool includes an electrically conductive cutting member, an electric motor for actuating the cutting member, a gripping handle electrically insulated from the cutting tool, a cutting trigger control that can be actuated by the hand of the user gripping the gripping handle, the cutting trigger control being electrically insulated from the cutting tool, an emergency stop device sensitive to a user coming into contact with the cutting member. The emergency stop device is controlled by a comparator comparing an impedance of a first electric circuit comprising the cutting tool and a second electric circuit used as a reference, the first and second circuits having manual contact electrodes provided on at least one of the gripping handle of the tool and the cutting trigger control. A method for controlling such a tool is also disclosed. The tool and method are is-applicable to electric secateurs and shears.

20 Claims, 2 Drawing Sheets

(58) Field of Classification Search
CPC .... F16P 3/12; F16P 3/148; B27B 5/38; B27B 13/14; B27G 19/02; B27G 619/00; Y10T 83/081; H02H 1/0007; G01V 3/06; B23D 45/06; B23D 47/08; B23D 59/001; B23D 55/08

See application file for complete search history.

(56) References Cited

U.S. PATENT DOCUMENTS

| | | | |
|---|---|---|---|
| 8,276,280 B2* | 10/2012 | Lee | A01G 3/037 30/228 |
| 2002/0069734 A1* | 6/2002 | Gass | B23D 55/08 83/485 |
| 2013/0127262 A1* | 5/2013 | Roser | H02H 1/0007 307/326 |

FOREIGN PATENT DOCUMENTS

| | | | | |
|---|---|---|---|---|
| FR | 2712837 A1 | | 6/1995 | |
| FR | 2779669 A1 | | 12/1999 | |
| FR | 2831476 A1 | | 5/2003 | |
| FR | 2838998 B1 | | 10/2003 | |
| FR | 2846729 B1 | | 2/2005 | |
| FR | 2963081 A1 | | 1/2012 | |
| FR | 3001404 A1 | | 8/2014 | |
| FR | 3074712 A1 | * | 6/2019 | ............... F16P 3/12 |
| WO | WO-2013136311 A1 | * | 9/2013 | ............ A01G 3/037 |

OTHER PUBLICATIONS

English Translation of the Written Opinion of the ISA for corresponding PCT/FR2018/052912.

* cited by examiner

ELECTRIC CUTTING TOOL WITH AUTOMATIC EMERGENCY STOP

TECHNICAL FIELD

The present invention concerns an electrically controlled safety cutting tool provided with an automatic emergency stop device. The emergency stop device is intended to prevent serious injury to the operator of the cutting tool in the event of inadvertent contact of the user with a cutting element of the cutting tool when the tool is in operation. At the very least, the aim of the invention is to limit any injury to being just a minor one.

A serious injury is characterized, for example with respect to electric pruning shears, by a deep cut, such as the complete severance of a part of an operator's finger. Whereas a minor injury may be compared to a skin scrape on the hand in a bush of brambles which may cause a little bit of bleeding.

The emergency stop device is considered to be automatic if the emergency stop is triggered without voluntary intervention by the operator, but upon the simple detection of a situation where there is a risk injury.

The invention can find applications for various cutting tools, and in particular for portable electric cutting tools with a moving blade, such as pruning shears or shears, or even chainsaws, circular saws, drills or grinders.

STATE OF PRIOR ART

An illustration of the state of the art is given by the following documents:
 FR 2712837
 FR 2779669
 FR 2831476
 FR 2838998
 FR 2846729
 FR 2963081
 FR 3001404
 EP 2490865
 EP 2825811
 U.S. Pat. No. 5,025,175
 U.S. Pat. No. 7,365,955

These documents refer to machines and tools with electric controls provided with an emergency stop device to avoid injury to an operator. Among these documents are to be found numerous tools such as electric pruning shears held by a single hand for trimming vegetation.

In this example, the operators hold the electric pruning shears in one hand and use their second free hand for handling the already cut or to be cut plant. A risk of injury exists when the hand not holding the pruning shears comes into immediate proximity or into contact with the cutting element during the cut. In the case of pruning shears or scissors, the cutting element presents itself in most cases in the form of a fixed blade or hook, and a pivoting blade. The pivoting blade pivots between an open position and a closed position on the hook, with a shearing effect between the pivoting blade and the hook. The cutting element of certain pruning shears may also consist of two mobile blades cooperating with each other in order to achieve the shearing effect when the blades pass from an open position to a closed position.

In the case of drills, grinders, circular or chain saws, the cutting element presents cutting parts in rotation around an axis.

In the case of machine tools such as shears, crushers or circular saws, cutting elements present themselves in the form of cutting parts rotating around an axis or in translatory motion relative to a fixed frame.

Various means are employed to detect the immediate proximity or the contact of the hand with the cutting element. One can distinguish in particular radio-electric means, potential detecting means on the blade, capacitive means or also impedance measuring means.

The known safety devices employ gloves, shoes or also a beacon, electrically connected to the safety device by a communication link. The link may be a wire link or possibly by Hertzian wave.

When gloves are used, the gloves are equipped with electric conductors and their function is to create a measuring circuit between the glove and the cutting element. Similarly, conductive shoes may be used to create a measuring circuit connected to the ground and including the operator's body.

The use of electronic beacons, conductive gloves and conductive shoes or more generally of a conductive item of clothing electrically linked to the cutting tool, serves to detect a contact of the operator with the cutting element. An emergency stop of the cutting operation, in response, for example, to the detection of the contact of the conductive item of clothing with the cutting element, makes it possible to avoid or limit the severity of a possible injury.

The known safety devices do however present a certain number of difficulties or drawbacks for the operator. These include in particular, the following:
 the discomfort caused by wearing conductive clothing, and in particular of conductive gloves,
 the discomfort caused by a wired connection between the conductive clothing and the pruning shears,
 a risk of severing the wired link between the conductive clothing and the pruning shears,
 a risk of injury if wearing the conductive clothing or the detection beacon is forgotten, or if these accessories are not worn properly.
 a risk linked to the failure of the contacts between the safety device and the cutting element. For example, the wear and tear of conductive gloves after too much use, poor maintenance, accidental deterioration, or the deposit of insulating substances on the glove or the cutting element such as sap, oil or grease, risk modifying or even obscuring the signal received by the safety device. This may, at short notice, render the safety device inoperative without the operator being aware of it beforehand.

DISCLOSURE OF THE INVENTION

The purpose of the present invention is to offer a safety cutting tool which does not present any of the aforementioned drawbacks.

In effect, the aim of the invention is to offer a safety cutting tool which does not make use of an electrically conductive item of clothing such as a glove and which does not require wearing a beacon.

The invention proposes a cutting tool including a safety device which simply uses the conductivity of the operator's body in immediate proximity or in contact with it, in order to detect the existence of a contact between the operator and the cutting element, and thereby prevent any risk of injury.

Utilization of the simple conductivity of the human body, measurable notably by its impedance, does however present some difficulties concerning the quality of the electric contact between the operator's body and the safety device or the cutting element. The intrinsic impedance of the human body is in effect of low value and does not vary. That is not the case of a contact impedance between the operator's body and a conductive part such as, for example, a manual contact electrode or the cutting edge of a conductive cutting blade. This impedance is in fact likely to vary in significant proportions. It may vary depending on the characteristics of the operator's skin, whether the skin is moist or not, the surface characteristics of a manual contact electrode (dimensions, roughness, conductivity, etc.), the climate conditions or contact pressure exerted by the operator.

For example, a hand with dry skin has very low conductivity. Its contact, with low pressure, on a manual contact electrode can generate a high contact impedance that can reach values of few hundred thousand Ohms. Inversely, contact with a moist hand, especially in a saline atmosphere by the sea, brings a low contact impedance of a few thousand Ohms, or even only a few hundred Ohms or just a few Ohms.

The contact of a part of the operator's body with the cutting element, may translate into an impedance value of a few Ohms, or even a few hundred Ohms, depending on the contact pressure exerted, if it occurs, for example, in a very conductive and cutting area such as the edge of the blade of pruning shears. However, the impedance value can be of few hundred Ohms or even a few thousand Ohms or more, if the contact occurs on another part of the cutting element, for example on the side of a cutting blade having a thin insulating coating.

These hazards can be avoided by using an item of clothing and/or an electrically conductive wired link resulting in a contact impedance varying only over a small range of values. If this is not the case, they must be taken into account so as not to compromise the safety of the cutting tool.

In effect, the simultaneous contact of an operator with a safety device and a cutting element can generate a very large range of possible impedance values between the cutting element and the tool including the safety device. It is not possible, in this case, to reliably establish the risk of an actual contact between the operator and the cutting element.

To overcome these difficulties, the present invention proposes a safety cutting tool including:

an electrically conductive cutting element,
an actuating motor of the cutting element that is electrically controlled,
a gripping handle of the cutting tool for the hand of an operator, the gripping handle being electrically insulated from the cutting element,
a cutting trigger control, activated by the operator's hand grasping the gripping handle, the cutting trigger control being electrically insulated from the cutting element and
an emergency stop device responsive to a contact of the operator with the cutting element.

According to the invention, the tool is characterized by:
at least one first and at least one second manual contact electrode; the first manual contact electrode and the second manual contact electrode being electrically insulated from each other and positioned on either the handle or the cutting trigger control,
a first electric circuit including the first manual contact electrode, a first electrical impedance and the cutting element. The first electric circuit is capable of closing upon a simultaneous contact of the operator with said first manual contact electrode and the cutting element,
a second electric circuit including the first and the second manual contact electrode, the first electrical impedance and the second electrical impedance; the second electric circuit is capable of closing upon a simultaneous contact of the operator with the first and the second manual contact electrode,
at least one measuring device of an impedance characteristic of the first electric circuit and an impedance characteristic of the second electric circuit,
a comparator of the impedance characteristic of the first electric circuit and at least one characteristic of threshold, which is dependent on the impedance characteristic of the second electric circuit,
the comparator being connected to the emergency stop device, to cause the emergency stop of the cutting tool in case of a crossing of the threshold characteristic.

One considers that the handle and/or the cutting trigger control are electrically insulated from the cutting element when at least a portion of the handle and/or the cutting trigger control carrying the manual contact electrodes and touched by the operator holding the handle, are electrically insulated from the cutting element, or are linked to the cutting element through the intermediary of an impedance with a value above several orders of magnitude to the values of impedance involved in the functioning of the safety device of the cutting tool, for example a value of several million Ohms.

The emergency stop device is servo-driven by the comparator to cause an emergency stop. By "emergency stop" is meant the immediate trigger of one of the following operations:

cutting off the power supply to the actuating motor,
an emergency brake acting on the actuating motor and/or directly on the cutting element,
triggering of an emergency movement of the cutting tool such as, for example, the opening of the cutting element, in the case of pruning shears, a shear or a compensating movement for the kinetic energy of the mobile parts of the cutting element.

When the actuating motor is an electric motor, the electromagnetic braking, the triggering of an emergency movement, or even the simple cut-off of the power supply, may occur through the intermediary of an electronic control card of the motor.

The cutting tool of the invention may be in particular pruning shears, a shear, a drill, a grinder, a circular saw, a chain saw or any other tool or machine-tool equipped with a cutting element to be made safe. Thus, the mention of pruning shears in the description which follows, for ease of reference or by simplification, does not prejudge the type of cutting tool.

"Characteristic of impedance" means a value of voltage, of current, an Ohmic value or more generally an electric characteristic linked respectively to the impedance of the first electric circuit and the second electric circuit. It is established by the measuring device. The threshold characteristic can also be a value of voltage, current or an Ohmic value which is dependent on the impedance characteristic of the second electric circuit. It may especially be proportional to the impedance characteristic of the second electric circuit or equal to this impedance characteristic.

The cutting tool of the invention calls for at least one pair of manual contact electrodes including the first and the second manual contact electrode. The manual contact electrodes are provided for an electrical contact with the operator's hand who grasps the gripping handle to control the tool. They can be positioned, while insulated from each other, on the gripping handle or on the cutting trigger control, such as the control trigger for the cut of electric pruning shears, the part of the trigger including the electrode being insulated from the cutting element.

The cutting actuator control is not necessarily a trigger control. It may also be an optical control detecting the presence of a finger, for example. The terms "cutting actuator control" are to be understood as to include in a general manner any member suitable for the actuation of the cut or more generally suitable to actuate the operation of the actuating motor of the cutting tool.

Although the description refers to two electrodes, a greater number of manual contact electrodes may well be used. In the description as follows, a reference to the first or the second manual contact electrode does not prejudge the unique or multiple character of these electrodes. The use of several first manual contact electrodes and several second manual contact electrodes may be considered in particular to improve an electrical contact with the operator's hand.

The terms "first impedance" or "second impedance" designate respectively one or more electronic components capable of including a resistive component but also an inductive and/or a capacitive component. In a preferred implementation, the first impedance and the second impedance may each be formed by an electronic component such as an electric resistance of defined value. The first impedance and the second impedance thus present fixed and known Ohmic values.

When the operator holds the gripping handle of the tool with one of his hands while using the tool, the hand comes into contact with the first manual contact electrode and with the second manual contact electrode. The manual contact electrodes may be metallic, electrically conductive electrodes or formed by electrically conductive surfaces of plastic material of the handle or the trigger. Examples include electrodes made of an intrinsic conductive polymer such as PolyPyrolle, or an extrinsic conductive plastic material charged, for example, with carbon or silver particles.

The simultaneous contact of the hand with the first and the second manual contact electrodes enables the electric connection of these electrodes through the intermediary of the operator's hand, with an impedance corresponding essentially to the sum of the contact impedances between the hand and each of the first and the second manual contact electrodes.

In order to ensure a good physical and electrical contact, the first manual contact electrode and the second manual contact electrode may be placed on opposite sides of the gripping handle. They may in particular be placed on the top and the underside of the handle, the top being generally oriented towards the part of the operator's hand closest to the arm whereas the underside of the handle is generally oriented towards the finger tips in the case of electric pruning shears. If a trigger is provided, the first manual contact electrode may also be placed on the control trigger of the cutting operation.

So, it is clear that the operator's hand presents a different part in contact with each of the manual contact electrodes and thus a contact impedance which may be different with each manual contact electrode. Each of these impedances also depends on the condition of the operator's hand, its pressure on the electrodes, the surface of the electrodes and also the ambient conditions.

While neglecting the impedance proper of the manual contact electrodes and the wiring, the contact impedances of the hand with each of the manual contact electrodes are in series with the first electrical impedance and the second electrical impedance in the second electric circuit. The values of the first and the second electrical impedance are known and set at the time of the manufacturing process of the pruning shears.

The measuring device of an impedance characteristic of a second circuit provides a value thereof, characterizing the sum of these impedances.

The first electric circuit, which includes the first manual contact electrode, the first electrical impedance and the cutting element, remains an open circuit when the operator seizes the gripping handle of the tool. Now, when it is open, the total impedance of the first electric circuit is quasi-infinite, and therefore inevitably greater than the impedance of the second electric circuit.

However, the first electric circuit is closed when the operator simultaneously touches the electrically conductive cutting element and the first manual contact electrode. In the following description, it is considered, for the sake of simplification, that the operator touches the cutting element with one finger of the hand which does not grasp the cutting tool. Any reference in the description below of the finger which touches the cutting element does not, however, prejudge the body part that may come into contact with the cutting element. The operation of the safety device of the invention is in fact identical during a contact of any other part of the operator's body, such as his face, forearm, leg or free hand, with the cutting element. When the first electric circuit is closed due to an inadvertent contact of the finger with the cutting element, associated with the contact of the hand with the first manual contact electrode, the first impedance, contact impedance of the hand with the first manual contact electrode, the impedance of the operator's body between his hand holding the handle and the finger touching the cutting element, the contact impedance of the finger with the cutting element, and the cutting element find themselves connected in series in the first electric circuit.

Thus, the measuring device of an impedance characteristic of the first electric circuit provides a value of the sum of these impedances.

It is estimated that the impedance of the electrodes, wiring and that of the cutting element are negligible. The order of magnitude of the impedance of the operator's body, between his first hand used to grasp the gripping handle and his finger of the other hand getting to touch the cutting element, is by the way known in the state of the art. It is the conductivity of the human body the impedance of which has a value below ten thousand Ohms, and in any case in the order of magnitude of a thousand Ohms. On the other hand, the contact impedance of the hand with the manual contact electrode(s) in the first and second electric circuit as well as the value of the contact impedance between the finger and the cutting element can present great variability and are most often far above the impedance value of the operator's body, particularly in case of weak contact pressure and a skin of the hand having weak conductivity. However, when the contact of the finger with the cutting element is close to risking an injury, the various tests conducted by the applicant show that the value of the impedance of contact of the finger can be evaluated as being of the same order of magnitude or even less than the impedance value of the operator's body. In effect, the finger presents significant elasticity when the blade comes into contact with it and it is only with significant pressure that the blade can first cut the epidermis of the finger, causing a minor injury before resulting in a severe injury as it pursues the cut. In the latter case, of a minor gash, such as a scrape on the epidermis, the value of the contact impedance between the cutting element and the subcutaneous parts of the body is then significantly lower than the value of the impedance of the human body.

It is therefore deduced from this that the value of contact impedance at the cutting element in case of a serious contact is lower than the impedance value of the human body. Detection of an impedance of this order of magnitude allows identification with very high probability of the existence of a sudden and unintentional contact of the operator with the cutting element.

The same is not true for the contact impedance between the operator's hand and that of the first manual contact electrode, the value of which may vary in more significant proportions. In fact, the simple measure of the impedance characteristic of the first circuit does not allow identifying the existence of a contact between the operator and the cutting element. As soon as there is a minor injury, the contact impedance then drops very rapidly to a value below the impedance of the human body and it drops further when there is a deep cut to reaching a very low value of a few hundred Ohms. The threshold impedance characteristic of such a contact, considering its overall low value and in any case estimated to be at an order of magnitude below the impedance of the human body, is largely masked by the possible variations of contact impedance between the operator's hand and the first manual contact electrode. It is therefore not possible to reliably characterize the existence of a contact risk at the cutting element by a simple measurement of the impedance characteristic of the first circuit.

It is therefore very important for the setting of a threshold value permitting to establish the certainty of a contact between the operator's finger and the cutting element to eliminate the variations of the contact characteristic between the operator's hand and the first manual contact electrode.

This occurs, in accordance with the invention, by setting a threshold characteristic from the impedance characteristic of the second circuit. It is thus possible to compare the impedance of the first electric circuit with that of the second impedance, by freeing oneself of the influence of the contact impedance of the hand with the manual contact electrodes and particularly the contact impedance of the hand with the first manual contact electrode. In case of passing from a high impedance value of the first electric circuit towards a lower value than the threshold determined from the measure performed on the second electrical circuit, one then determines the existence of a very high risk of contact between the operator and the cutting element. The emergency stop device is then actuated.

As indicated, the threshold characteristic is set to be dependent on the impedance characteristic of the second electric circuit which serves as reference circuit.

The impedance of the second electric circuit is equal to the sum of the first impedance, the second impedance and the contact impedances of the hand of the manual contact electrodes. The sum of the first impedance and the second impedance is preferably set at a value superior to the sum of an estimated impedance of the operator's body and an estimated contact impedance of the finger on the cutting element without a serious injury. For example, by expressing the impedances and the impedance characteristics in Ohms, the cumulative value of the first and the second impedance can be chosen to be greater than 20 k$\Omega$, and preferably greater than 100 k$\Omega$. The impedance of the body and the contact impedance of the finger are being estimated less than 10 k$\Omega$ each.

In such a case, and in the absence of a contact of the finger with the cutting element, the impedance of the first circuit is quasi-infinite and clearly greater than 20 k$\Omega$ or 100 k$\Omega$. Selecting a greater impedance value than the one resulting from an injury makes it possible to make the device even safer and to avoid an injury, including a minor injury.

When the finger comes into contact with the cutting element, the impedance of the operator's body and the contact of his finger on the cutting element, in the first electric circuit then becomes less than the impedance value of the sum of the first and the second electrical impedance of the second electric circuit. Thus, the characteristic of measured impedance of the first electric circuit becomes less than the threshold impedance characteristic or, at the very least crosses over the threshold characteristic. It should be recalled that the measured impedance characteristic can be expressed in the form of a voltage, current or Ohmic value. Depending on the case, the threshold value is exceeded when the impedance characteristic of the first circuit transitions from a value above the threshold characteristic to a value below the threshold characteristic (in case of voltage or impedance) or by transitioning from a value less than the threshold characteristic to a value above the threshold characteristic (in case of current).

It should be noted that the values of the first impedance and the second electrical impedance are not necessarily above an estimated value of the sum of the impedance of the operator's body and the contact impedance of the finger. As a matter of fact, by choosing a threshold characteristic which is dependent on the impedance characteristic of the second circuit, and in particular proportionally to this impedance characteristic, it is possible to adjust the threshold characteristic with a coefficient of proportionality so as to optimize the safety of the tool.

According to preferred modes of implementation, one or several of the following characteristics may be retained:
the second electrical impedance presents an Ohmic value greater than 20 k$\Omega$ and preferably greater than 100 k$\Omega$.
the first electrical impedance presents an Ohmic value equal to the second electrical impedance.
the first electrical impedance and the second electrical impedance are purely resistive.

According to a preferred implementation of the invention, the first electrical impedance may present an Ohmic value equal to the second electrical impedance and greater than 20 k$\Omega$, and the first threshold characteristic may be chosen to be equal to the impedance characteristic of the second circuit.

The measurement of the impedance characteristic of the first electrical circuit and the measurement of the impedance characteristic of the second electric circuit are not necessarily concomitant but can be alternated depending on the cut activations. The fact of alternating the measurements makes it in effect possible to use a unique measuring device in order to measure the impedance characteristics of the two circuits.

In this case, the second electric circuit may include a switch; the switch being servo-driven by the cut activation control to open the second circuit during a cut activation, and to close the second circuit in the absence of a cut activation; the measuring device being configured to measure an impedance characteristic of the first electric circuit when the second circuit is open and to measure an impedance characteristic of the second electric circuit when the second circuit is closed.

The term "switch" is understood here in the functional manner. It may be an electromechanical switch or a transistor switch passing from a conductive state to a blocked state and inversely.

The switch is considered to be servo-driven by the cut activation control when its opening is mechanically or electrically triggered by the actuation of the cut activation control.

In the case of an alternative measurement of the impedance characteristic of the first electric circuit and the impedance characteristic of the second electric circuit, the threshold value which depend on the impedance characteristic of the second electric circuit can be modified and updated at regular time intervals and/or at each new measurement of this impedance characteristic.

Also, the cutting tool may include a storage memory of the threshold characteristic. The memory can be refreshed at each new measurement, and the stored value is provided to the comparator.

As mentioned previously, the measuring device does not necessarily measure an impedance of the first and the second circuit, but at least an impedance characteristic, which is to say a characteristic born at the impedance. In particular, the measuring device may include a source of electric current in series with the first and the second electric circuit and at least one of:
a voltmeter connected in parallel to the terminals of the first impedance,
an amperemeter or an ohmmeter connected in series instead of the first impedance.

In this case, the voltage registered by the voltmeter, the current intensity registered by the amperemeter or the impedance registered by the ohmmeter are usable as impedance characteristics.

The threshold characteristic may be set in a comparable manner as being a voltage, an impedance or a threshold current.

Closure of the first electric circuit by a contact of the finger on the cutting element triggers, if necessary, an increase of the current going through the first circuit, a decrease of the voltage at the terminals of the first impedance or a decrease of the impedance characteristic, and thus a crossing of the threshold characteristic.

According to an improved mode of implementation, the source of electric power for the measuring device can be a source of alternating current. This is, for example, a source with an alternating frequency of 10 kHz. By using an alternating current source, it is possible to consider the implementation of the invention with a tool whose conductive cutting element would be coated with an insulating coating to especially prevent any corrosion of the blade. For example, the blade may be covered with a thin PTFE coating so as to facilitate its sliding over the counter blade during the cut. The contact of the finger with the cutting element would in this case be a mainly capacitive contact. For example, if the cutting blade is covered with a protective coating against corrosion, dirt or sap, the contact is nevertheless identified. It must be noted here, however, that the cutting edge of the blade is free of this type of coating, the cutting edge of the blade being too tapered for such a protective coating to adhere to it.

The cutting tool may include a control electrode connected electrically to the cutting element. The control electrode in this case, makes it possible to simulate a contact of the operator with the cutting element, so as to test the proper functioning of the emergency stop device without having to risk a cut.

Furthermore, the tool may include a monitoring circuit of an electric potential of the cutting element so as to confirm its presence in the electric circuit. The emergency stopping device of the electric motor is then servo-driven by the monitoring circuit to cause a stop of the electric motor when the electric potential of the cutting element is outside of a set value.

In particular, when the cutting element is normally connected to a ground potential of the tool, the monitoring circuit is able to detect any difference of potential other than zero between the cutting element and the ground of the tool. In this case, the electrical supply to the actuating motor is cut off in response to the detection of such a non-zero potential difference with the cutting element.

Monitoring of the potential of the cutting element prevents a malfunction of the emergency stop device when the cutting element finds itself accidentally brought to a potential that could affect or disturb the measurements of the impedance characteristics.

The emergency stop device, servo-driven by the comparator, may include at least one of the following:
a circuit breaker of a power supply to the electric motor,
an electronic control card of the electric motor commanding a stop of the motor or an actuation of the motor so as to cause an emergency movement of the cutting element, for example, an inverse rotation, thereby opening the cutting blade or to cancel the inertia of parts in motion during the cut,
a cutoff switch of the trigger command for a cutting operation, and
an emergency brake of the cutting element, acting, for example, directly on the cutting element.

The brake may be an electromagnetically controlled brake.

In a preferred implementation, the electric motor can be run by an electronic control card. The card serves to determine the rotation of the motor and particularly the sense of rotation governing an opening or a closure of the cutting element. In case the threshold characteristic described above is crossed over, the electronic card may directly receive the signal of the comparator or may integrate the comparator so as to master-control an extremely fast immobilization of the motor, a braking of the motor or a servo-drive of the motor to compensate for the inertia of the parts in motion and hence of the cutting element.

In the case of pruning shears, knowing that the time for the blade to pass from the open position to the closed position is in the order of 250 ms, the emergency stop device is preferably sized so as to be able to immobilize the blade or reverse its movement within less than 10 milliseconds and preferably in less than 1 millisecond. The flesh in contact with the cutting element is in fact sufficiently elastic to support a contact with the cutting element without creating a minor injury during this lapse of time.

The invention also concerns a process of controlling a cutting tool including:
an electrically conductive cutting element,
an electrically controlled actuating motor of the cutting element,
a gripping handle of the cutting tool for the operator's hand, electrically insulated from the cutting element and provided with at least one first manual contact electrode and at least one second manual contact electrode.

In accordance with the invention, when an operator seizes the gripping handle and touches the first and the second manual contact electrode,
one compares:
an impedance characteristic of a first electric circuit including the first manual contact electrode, a first electrical impedance and the cutting element, and a threshold characteristic that is a function of a second electrical circuit impedance value including the first manual contact electrode, the second manual contact electrode, the first electrical impedance and a second electrical impedance, and an emergency stop of the cutting tool is triggered when the impedance characteristic of the first electric circuit crosses the threshold characteristic.

As mentioned previously, during the emergency stop it is possible to cause an immediate release of one of the following operations:

cutting off the power supply to the actuating motor, braking operation acting on the actuating motor and/or the cutting element, triggering of an emergency movement of the actuating motor.

The second electrical impedance is preferably chosen with an absolute value above 20 kΩ and preferably above 100 kΩ.

When the cutting element is normally connected to the ground of the tool, one can also cause an emergency stop of the actuating motor in response to a potential other than zero on the cutting element, that is to say a potential difference other than zero between the cutting element and the ground of the tool.

And it is also possible to cause either an emergency stop of the actuating motor or making the actuating motor inoperational in case of detection of an accidental opening of the second electrical circuit.

The accidental opening of the second electric circuit may indicate the fact that the operator's hand potentially grasping the gripping handle is not or is no longer in simultaneous contact with the two manual contact electrodes which risks altering the establishment of the threshold characteristic or risks compromising the detection of a contact of the finger with the cutting element.

By making the actuating motor non-operational, for example by removing the power from an electric motor, usage of the tool can be prevented.

This measure prevents an operator wearing electrically insulating gloves from using the tool and the electrically insulating gloves prevent or interfere with the detection of a contact of the finger with the cutting element. An accidental opening of the second electric circuit results in an infinite impedance of this circuit or a zero-current circulating in the first impedance mentioned previously. This situation can be detected, for example, by the measurement of a zero voltage, by a voltmeter connected in parallel to the first electrical impedance, or by the measurement of a zero current, by an amperemeter connected in series with the first electrical impedance, while the switch of the second electric circuit is closed. The threshold characteristic can in this case be established on the basis of a single value and can generate at the comparator a signal to activate the emergency stop of the tool.

If necessary, the operator may wear electrically conductive gloves, in particular to protect himself from the cold. It is however important that the contact of the hand with the glove does not generate significant variations of impedance and in particular greater than the variations of a direct contact of the hand with the manual contact electrode. Conductive gloves do not modify, in this case, the operation of the tool of the invention and in particular its safety functions.

Other characteristics and advantages will become clear from the description which follows in reference to the figures. This description is given for illustrative purposes and is not limiting.

BRIEF DESCRIPTION OF THE FIGURES

Identical or similar parts of FIGS. 1 and 2 have the same numerical references so as to facilitate the transfer from one figure to the other.

DETAILED DESCRIPTION OF IMPLEMENTATIONS OF THE INVENTION

Figure 1:
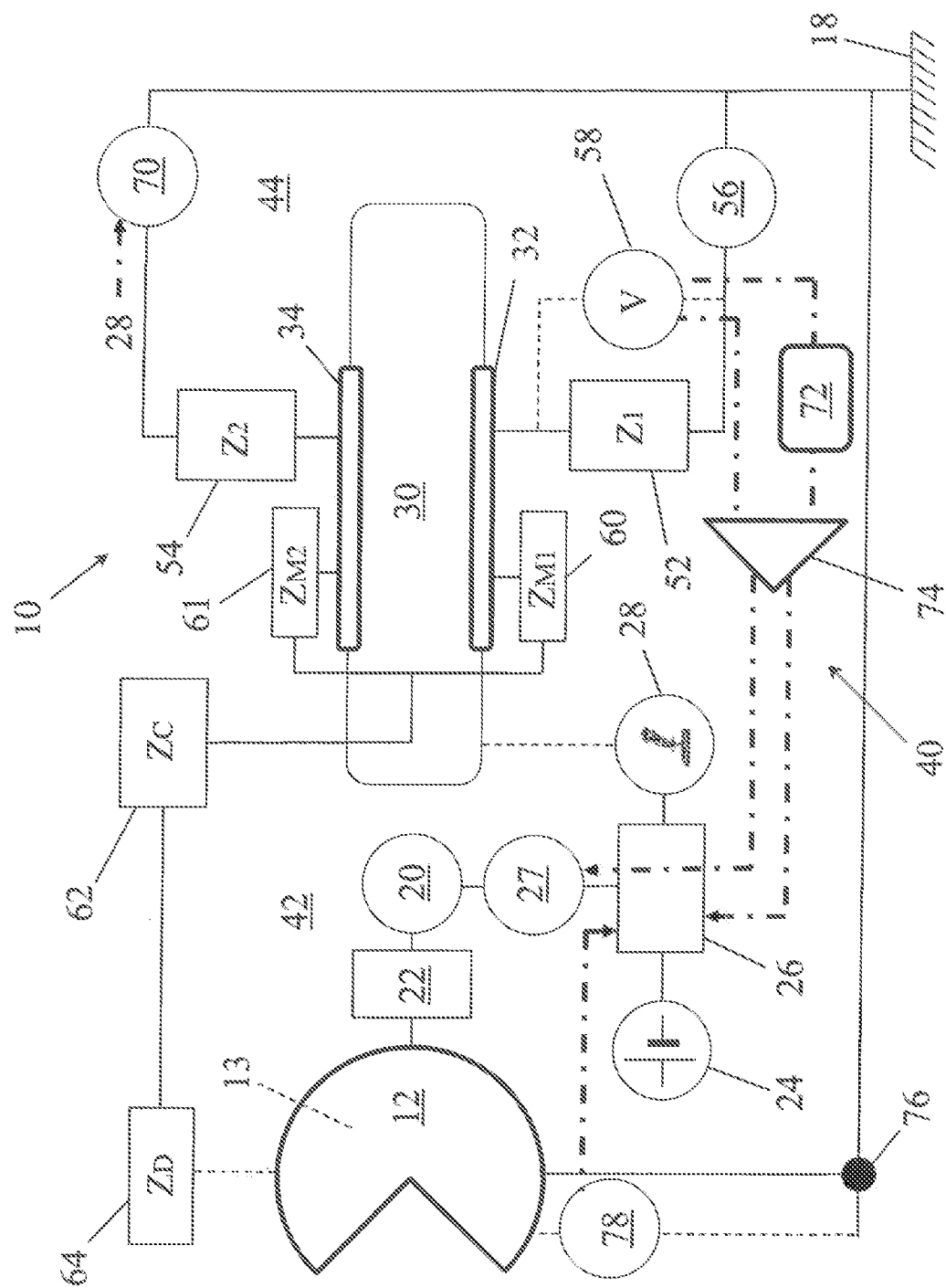
FIG. 1 is a simplified schematic representation of the main characteristics and functions of a cutting tool in accordance with the invention.
Figure 2:
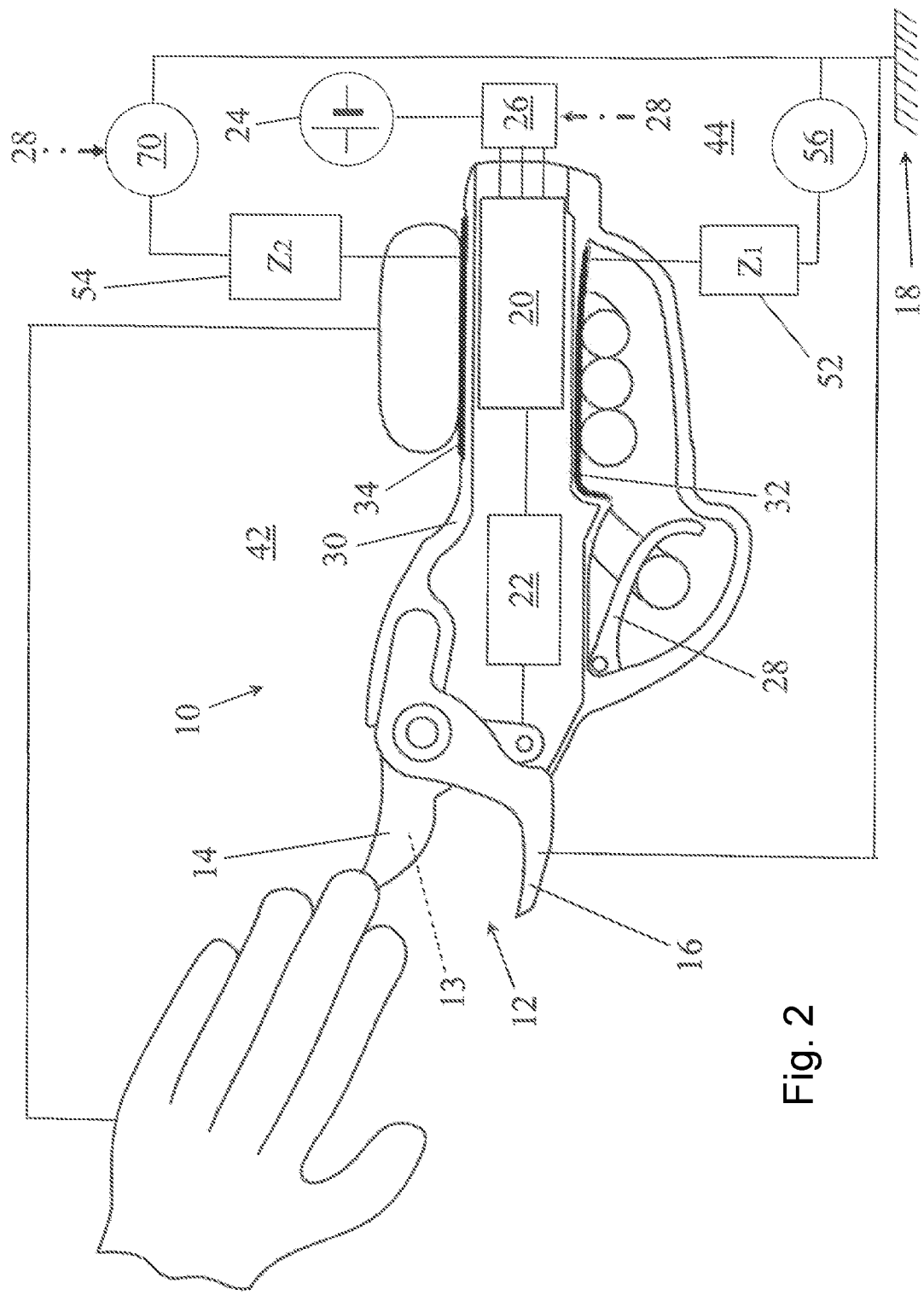
FIG. 2 is a simplified schematic representation of a pruning shears in accordance with the invention.

FIG. 1 schematically shows a safe tool 10 provided with a cutting element 12. FIG. 2 shows the particular example of an electric pruning shears 10, the cutting element of which is formed by a mobile blade 14 capable of closing onto a hook 16 and any reference to this particular construction refers to FIG. 2.

The blade and the hook are metallic and electrically conductive parts. They may possibly be covered with an electrically insulating polymer coat 13.

The cutting element 12 is electrically connected to the ground 18 of the pruning shears constituting a reference potential.

The pruning shears also include an electric motor 20 that is mechanically connected to the cutting element 12, through a transmission mechanism 22. In the example of FIG. 2, it makes the mobile blade 14 pivot between an open position and a closed position on the hook 16.

The motor is associated to an electric power supply 24 and to an electronic control card 26 of the motor. The electronic control card 26 can receive signals of a cut release command 28 activated by a hand of the operator grasping a gripping handle 30 of the electric pruning shears 10. The cut release control, for example a trigger control as shown in FIG. 2, is positioned in proximity of the gripping handle 30.

The gripping handle is also provided with a pair of manual contact electrodes 32 and 34, positioned respectively on two essentially opposite parts of the handle. The manual contact electrodes are metallic electrodes the operator's hand comes necessarily into contact with when the safe tool is seized by its handle. They are electrically insulated from each other and are electrically insulated from the cutting element 12. The gripping handle 30 may be made of insulating plastic material for this purpose.

An emergency stop device 40 of the electric motor 20 of the pruning shears is governed by two electric circuits 42, 44. The electric circuits 42, 44 include components of the pruning shears but may also include parts of a human body using the pruning shears 10.

The first electric circuit 42 includes, in series, a component forming a first electrical impedance 52, a first manual contact electrode 32 and the cutting element 12.

The first electrical impedance 52, the value which is noted Zi may be a simple electronic component such as an electric resistance. Its value is preferably defined to be equal or greater than 100 kΩ.

The first electric circuit 42 is normally an open circuit having consequently a quasi-infinite global impedance.

When an operator seizes the handle, his hand comes into contact with the manual contact electrodes and thus with the first manual contact electrode 32. The first electric circuit 42 remains open.

Whereas, when the operator also touches the cutting element 12, for example with a finger of his free hand, he closes the first electric circuit 42. In this case, the first electrical impedance 52 finds itself successively in series with the first manual contact electrode, a contact impedance 60 of the operator's hand with the first manual contact electrode 32, an impedance 62 of the operator's body; a contact impedance 64 of the finger with the cutting element, and finally the cutting element 12.

One may note here that the circuit would also be closed if the operator indirectly touched the cutting element through the intermediary of another conductive item such as a branch, a wine stalk or even an iron trellis wire which would be in the process of being cut by the cutting element. This situation only adds a supplemental impedance in the circuit and does not put the invention in question. Only the case of a direct contact of the finger with the cutting element will be dealt with below.

The values of the contact impedance 60 of the hand, the impedance 62 of the body and the contact impedance 64 of the finger with the cutting element are noted $Z_{M1}$, $Z_C$ and $Z_D$ respectively.

Thus, when the first circuit is closed, a total impedance $Z_{42}$ is such that:

$$Z_{42}=Z_1+Z_{M1}+Z_C+Z_D$$

The impedance of wiring and the cutting element are ignored here.

A measuring device of an impedance characteristic of the first electric circuit is provided. In the example of implementation of FIG. 1, it includes a source of alternating current 56 in series with the first circuit 42, and a voltmeter 58 connected in parallel with the first impedance 52. The value of voltage measured by the voltmeter is, in this case, the impedance characteristic of the first circuit, in the sense of the invention.

A second electric circuit 44 includes the first electrical impedance 52, the first manual contact electrode 32, the second manual contact electrode 34 and a second electrical impedance 54. Just like the first electrical impedance, the second electrical impedance may be formed by an electronic component such as a simple resistance of a defined value, preferably above 100 kΩ. Its impedance value whether real or complex, is marked $Z_2$.

The second electric circuit is also an open circuit when the operator does not seize the gripping handle 30 of the electric pruning shears 10. The manual contact electrodes 32, 34 are in effect electrically insulated from each other.

However, when the operator seizes the gripping handle 30, his hand does electrically connect the first and the second manual contact electrode 32, 34. A contact impedance 60 of the operator's hand with the first manual contact electrode and a contact impedance 61, of a value noted as $Z_{M2}$ of the operator's hand with the second manual contact electrode thus are added in series in the second circuit.

In this case, the impedance $Z_{44}$ of the second electrical circuit 44 is such:

$$Z_{44}=Z_1+Z_2+Z_{M1}+Z_{M2}$$

Now, the values $Z_{M1}$ and $Z_{M2}$ are coming from contacts of the same kind and their variations are therefore similar. The same is the case for the value $Z_D$ in the first circuit and each circuit thus includes two values of contact impedance of the same kind. A comparison of $Z_{42}$ and $Z_{44}$ makes it possible to eliminate the variations of the contact impedances with the manual contact electrodes, and to measure the occurrence of a contact of the operator's finger with the cutting element by evaluating $Z_C$ and $Z_D$ opposite $Z_2$ and $Z_{M2}$.

A measuring device is also provided to establish an impedance characteristic of the second electric circuit. In the example of implementation described here, this is the source of the alternating current 56 and the voltmeter 58 previously mentioned and also used in connection with the first electric circuit 42. The voltage measured at the terminals of the first electrical impedance 52 is a value of the characteristic of the second electric circuit 44.

Since a single measuring device is provided to measure the impedance characteristics of the first and second electric circuit 42, 44, an alternate measure is provided.

For this purpose, the second electrical circuit 44 includes a switch 70 to open or close the second electric circuit. The switch 70 may be of the electromechanical type or, preferably, an electronic transistor switch.

The switch 70 is servo-driven by the cutting trigger control 28 so as to be closed in the absence of a cutting command and so as to open in case of a cutting command.

In the absence of a cutting command, the risk of the operator being cut by the cutting element does not exist. The first circuit is open, supposing that the operator does not touch the cutting element. Switch 70 of the second circuit is then closed and enables a measurement of the characteristic of the second electric circuit 44. However, an electrical characteristic of singular value can be measured in the case where the operator does not simultaneously touch the two manual contact electrodes, and therefore when the circuit 44 is open in spite of the switch 70 being closed.

When the operator activates the operation of the cutting element, for example, by reinforcement of a trigger connected to the cutting release control 28, the switch 70 of the second electric circuit 44 is open so as to enable a measurement of the impedance characteristic of the first electric circuit 42.

Each time the impedance characteristic of the second electrical circuit 44 is measured, the value of this impedance characteristic, or a value proportional to the impedance characteristic, is updated and stored in a memory 72 until a next measurement. The measurement of the impedance characteristic of the second electric circuit 44 and the update of the memory 72 can be made at each closing of the switch 70 of the second electric circuit or at predetermined intervals when said switch remains closed.

The stored value constitutes a threshold characteristic.

The memory 72 is connected to an input of a comparator 74 so as to supply the threshold characteristic as reference value.

A second input of the comparator 74 receives the impedance characteristic of the first electric circuit at the time of a cutting release, which is to say when the switch 70 of the second electric circuit 44 is open.

The impedance characteristic of the first electrical circuit is thus compared to the threshold value.

An output of the comparator 74 is connected to the electronic control card 26 of the motor 20. If the threshold value is deviated from, by a higher or lower value, according to the impedance characteristic selected, the comparator emits a signal in the direction of the electronic control card of the motor. The comparator can also emit such a signal in case of the presence of a single value in the memory 72, signifying a fault of simultaneously maintaining contact with the two manual contact electrodes and thereby obscuring the possibility of detecting a contact between the finger and the cutting element. The signal is used by the electronic card to trigger an emergency stop of the motor and the cutting operation. The emergency stop may include, for example, the opening of a circuit of electric power supply, or a servo-drive of the motor to block the movement of the cutting element.

The electronic control card 26 of the motor is thus a part of the emergency stop device 40. The emergency stop device may also include a switch 27 for opening a circuit of an electric power supply of the motor.

In a particularly simple implementation of the cutting tool, the first electric impedance 52 and the second electric impedance 54 may be set at a same value $Z_1=Z_2$ in the order of 100 kΩ or 200 kΩ. These values are clearly much higher than an estimated impedance of the human body and to an estimated impedance of contact of the finger with the cutting element.

An impedance of the human body is estimated to be less than 10 kΩ. The same is the case for the impedance of the finger with the cutting element, which is estimated to be below 10 kΩ, and rather by an order of magnitude of 1 kΩ, especially after an emerging injury.

In this example of implementation, the retained threshold characteristic $Z_{threshold}$ is directly the measured impedance of the second circuit, namely:

$$Z_{threshold}=Z_{44}=Z_1+Z_2+Z_{M1}+Z_{M2}$$

When the first electronic circuit is open, its impedance $Z_{42}$ is quasi infinite and $Z_{42}>Z_{threshold}$ On the other hand, when the operator holding the handle simultaneously touches the cutting element, the impedance of the first electric circuit becomes $Z_{44}=Z_1+Z_{M1}+Z_C+Z_D$ The comparator 74 thus compares: $Z_1+Z_{M1}+Z_C+Z_D$ and $Z_1+Z_{M1}+Z_{M2}+Z_2$.

By eliminating $Z_1$ and $Z_{M1}$ in the two total impedances, this amounts to comparing the sum of the impedance of the operator's body and the contact impedance with the cutting element to the electrical impedance $Z_2$ increased by a value $Z_{M2}$.

Thus, as $Z_2$ is chosen to be greater than the estimated values of $Z_C$ and $Z_D$, the sum of $Z_{M2}+Z_2$ is greater than the sum of $Z_C$ and $Z_D$ and one gets: $Z_{42}<Z_{threshold}$ The threshold has been exceeded and the comparator delivers an emergency stop signal.

Reference 76 designates a control electrode electrically connected to the cutting element 12. It is provided to allow an emergency stop test without touching the cutting element. In fact, it suffices for the operator grasping handle 30 and simultaneously touching the control electrode 76 with his free hand to cause an emergency stop. The electronic control card 26 can possibly be configured to request such a periodic control operation, so as to ensure the proper functioning of the emergency stop device.

A monitoring circuit 78 of the potential of the cutting element is also provided. It is built around a voltmeter and is also linked to the electronic control card 26 of the electric motor 20 to cause an emergency stop when an electric potential of the cutting element becomes different from a set value. In the example of implementation shown, one verifies that the electric potential of the cutting element is at the reference potential of the tool.

FIG. 2 shows a schematic pruning shears, with a partial cutaway to make visible the electric drive motor 20 of the cutting element 12, as well as the transmission mechanism 22 between the motor 12 and the mobile blade 14.

FIG. 2 illustrates the contact of the hand with the manual contact electrodes 32 and 34 when the operator grasps the gripping handle 30 for a functional utilization of the pruning shears. It can be observed that the fingers and more precisely the middle finger, the ring finger and the pinky come into contact with the first manual contact electrode 32 of the first electrical circuit 42. The first manual contact electrode 32 is here positioned on a lower part of the gripping handle 30 in an operating position of the pruning shears.

A part of the palm comes into contact with the second manual contact electrode 34 positioned here on an upper part of the gripping handle 30.

The index finger of the hand is free to actuate a controller 28 which is here constituted by a control trigger for triggering the cutting element.

The thumb is located in front of the section and bent around the handle of the tool for a good grip on the tool is not shown.

The operator's free hand is shown in a position where one finger comes into contact with the mobile blade 14 of the cutting element 12. The hand holding the gripping handle of the pruning shears 10 and the hand coming into contact with the cutting element are connected by a drawn line symbolizing the human body.

The electronic control card 26 of the electric motor is connected to the electric motor 20 by three wires. This is a three-phase control. It can be used to control the rotation of the motor in a direction causing the closure of the mobile blade 14 on the hook 16. It can also be used, during an emergency stop, in an inverse direction of rotation, causing the opening of the cutting element, and counteracting its closing. Finally, it can be used as an electromagnetic brake, for example, by short-circuiting the motor phases.

The electronic control card is also connected to an electric power supply 24, such as, for an example, an electric battery carried on the operator's back.

The invention claimed is:

1. A safety cutting tool comprising:
an electrically conductive cutting element;
an electrically controlled actuating motor cooperative with said electrically conductive cutting element;
a gripping handle electrically insulated from said electrically conductive cutting element, said gripping handle adapted to be gripped by a hand of an operator;
a cutting trigger control electrically insulated from said electrically conductive cutting element, said cutting trigger adapted to be activated by the hand of the operator; and
an emergency stop device adapted to be responsive to a contact of the operator with said electrically conductive cutting element, said emergency stop device comprising:
at least one first manual contact electrode;
at least one second manual contact electrode, said at least one first manual contact electrode and said at least one second manual contact electrode being electrically insulated from each other and positioned on at least one of said gripping handle and said cutting trigger control;
a first electrical circuit having a first manual contact and a first electrical impedance of said electrically conductive cutting element, said first electrical circuit adapted to close upon a simultaneous contact of the operator with said at least one first manual contact electrode and said electrically conductive cutting element;

a second electrical circuit having said at least one first manual contact electrode and the at least one second manual contact electrode and the first electrical impedance and a second electrical impedance, said second electrical circuit adapted to close upon a simultaneous contact of the operator with said at least one first manual contact electrode and said at least one second manual contact electrode;

at least one measuring device that measures an impedance characteristic of said first electrical circuit and an impedance characteristic of said second electrical circuit; and a comparator circuit of the impedance characteristic of the first electrical circuit and of at least one threshold characteristic dependent on the impedance characteristic of said second electrical circuit, said comparator circuit being connected to said emergency stop device so as to cause said electrically conductive cutting element to stop when the at least one threshold characteristic is crossed.

2. The safety cutting tool of claim 1, wherein the second electrical circuit includes a switch, the switch being driven by said cutting trigger control in order to open the second circuit during a cutting trigger and close the second circuit in the absence of a cutting trigger, wherein said at least one measuring device is configured to measure an impedance characteristic of said first electrical circuit when said second electrical circuit is open and measure the impedance characteristic of said second electrical circuit when the second electrical circuit is closed.

3. The safety cutting tool of claim 1, wherein said at least one measuring device has a source of electrical current in series with said first electrical circuit and said second electrical circuit and at least one of a voltmeter connected in parallel with terminals of the first electrical impedance and an ammeter or an ohmeter connected in series with the first electrical impedance.

4. The safety cutting tool of claim 1, wherein the source of electrical current is an alternating power source.

5. The safety cutting tool of claim 1, wherein the first electrical impedance has an Ohmic value equal to an Ohmic value of the second electrical impedance and is greater than 20 kΩ and in which the threshold characteristic of said first electrical circuit is equal to the impedance characteristic of said second electrical circuit.

6. The safety cutting tool of claim 1, further comprising:
a memory cooperative with said emergency stop device and adapted to store the threshold characteristics.

7. The safety cutting tool of claim 1, further comprising:
a control electrode electrically connected to said electrically conductive cutting element.

8. The safety cutting tool of claim 1, further comprising:
a monitoring circuit that monitors an electrical potential of said electrically conductive cutting element, said emergency stop device of said electric motor being driven by the monitoring circuit in order to cause a stop of said electric motor when the electrical potential of the cutting element is outside a set point range.

9. The safety cutting tool of claim 1, wherein said emergency stop device has at least one of a power cutoff switch of the electrically controlled actuating motor and an electronic control card for the electrically controlled actuating motor and a cutoff switch of the cutting trigger control and an emergency brake for the electrically conductive cutting element.

10. The safety cutting tool of claim 1, wherein the at least one first manual contact electrode and the at least one second manual contact electrode are positioned on opposite sides of said gripping handle.

11. The safety cutting tool of claim 1, wherein said second electrical impedance has an Ohmic value grater than 20 kΩ.

12. The safety cutting tool of claim 1, wherein the first electrical impedance has an Ohmic value equal to an Ohmic value of the second electrical impedance.

13. The safety cutting tool of claim 1, wherein said electrically conductive cutting element is a pruning shears.

14. The safety cutting tool of claim 1, wherein said electrically conductive cutting element is a scissors.

15. A process of controlling a cutting tool in which the cutting tool has an electrically conductive cutting element and an electrically controlled drive motor that actuates the electrically conductive cutting element and a gripping handle, the gripping handle being electrically insulated from the electrically conductive cutting element, the gripping handle having at least one first manual contact electrode and at least one second manual contact electrode, the process comprising comparing an impedance characteristic of the first electrical circuit and a threshold characteristic when an operator grasps the gripping handle and touches the first manual contact electrode and the second manual contact electrode, the first electrical circuit having the first manual contact electrode and a first electrical impedance and the electrically conductive cutting element, the threshold characteristic being dependent on an impedance value of a second electrical circuit, the second electrical circuit having the first manual contact electrode and the second manual contact electrode and the first electrical impedance; and triggering a stop of the electrically conductive cutting element when the impedance characteristic of the first electrical circuit crosses the threshold characteristic.

16. The process of claim 15, further comprising:
causing an emergency stop of an electrically controlled actuating motor when a non-zero voltage potential is detected on the electrically conductive cutting element.

17. The process of claim 16, further comprising:
cutting off a power supply to the electrically controlled actuating motor when the step of triggering occurs.

18. The process of claim 16, further comprising:
braking the electrically controlled actuating motor or the electrically conductive cutting element when the step of triggering occurs.

19. The process of claim 16, further comprising:
initiating an emergency movement of the electrically controlled actuating motor when the step of triggering occurs.

20. The process of claim 16, wherein the electrically controlled actuating motor is stopped or deactivated when an accidental opening of the second electrical circuit is detected.

* * * * *